(12) United States Patent
Robbs et al.

(10) Patent No.: US 10,607,687 B2
(45) Date of Patent: Mar. 31, 2020

(54) APPARATUSES AND METHODS FOR SENSE LINE ARCHITECTURES FOR SEMICONDUCTOR MEMORIES

(71) Applicant: MICRON TECHNOLOGY, INC., Boise, ID (US)

(72) Inventors: Toby D. Robbs, Boise, ID (US); Charles L. Ingalls, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/857,327

(22) Filed: Dec. 28, 2017

(65) Prior Publication Data
US 2019/0206480 A1   Jul. 4, 2019

(51) Int. Cl.
| G11C 11/4091 | (2006.01) |
| H01L 27/108 | (2006.01) |
| G11C 11/4097 | (2006.01) |

(52) U.S. Cl.
CPC ...... *G11C 11/4091* (2013.01); *G11C 11/4097* (2013.01); *H01L 27/10897* (2013.01)

(58) Field of Classification Search
CPC ............ G11C 11/4091; G11C 11/4094; G11C 11/4097; H01L 27/10897; H01L 27/11; H01L 27/11206; H01L 27/10847; H01L 27/11514
See application file for complete search history.

(56) References Cited

U.S. PATENT DOCUMENTS

| 5,107,459 A | 4/1992 | Chu et al. |
| 5,864,181 A | 1/1999 | Keeth |
| 6,034,879 A | 3/2000 | Min et al. |
| 6,043,562 A | 3/2000 | Keeth |
| 6,084,816 A | 7/2000 | Okamura |
| 6,567,288 B2 | 5/2003 | Keeth |
| 7,259,464 B1 | 8/2007 | Batra |
| 2002/0125538 A1 | 9/2002 | Abedifard et al. |
| 2005/0047191 A1 | 3/2005 | Watanabe |
| 2005/0174866 A1* | 8/2005 | Wada ............... G11C 7/065 365/205 |

OTHER PUBLICATIONS

International Search Report and Written Opinion for PCT Application No. PCT/US2078/066558 dated Apr. 12, 2019, pp. all.

* cited by examiner

*Primary Examiner* — Thanh Y. Tran
(74) *Attorney, Agent, or Firm* — Dorsey & Whitney LLP

(57) ABSTRACT

Apparatuses and methods for sense line architectures for semiconductor memories are disclosed. An example apparatus includes a first array region including first portions of a plurality of sense lines and memory cells coupled to the first portions of the plurality of sense lines and further includes a second array region including second portions of the plurality of sense lines and memory cells coupled to the second portions of the plurality of sense lines. An array gap is disposed between the first and second array regions and includes third portions of the plurality of sense lines and does not include any memory cells. Each third portion of the plurality of sense lines includes conductive structures having vertical components configured to couple the first portions and second portions of the plurality of sense lines to provide an electrically continuous sense lines through the first and second array regions and the array gap.

19 Claims, 5 Drawing Sheets

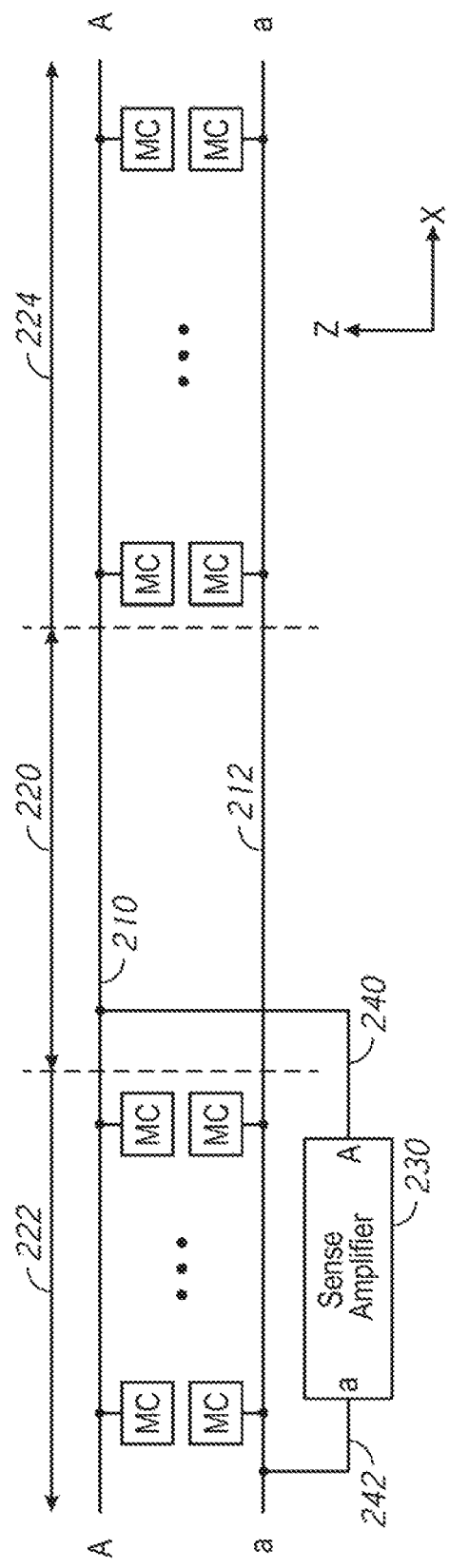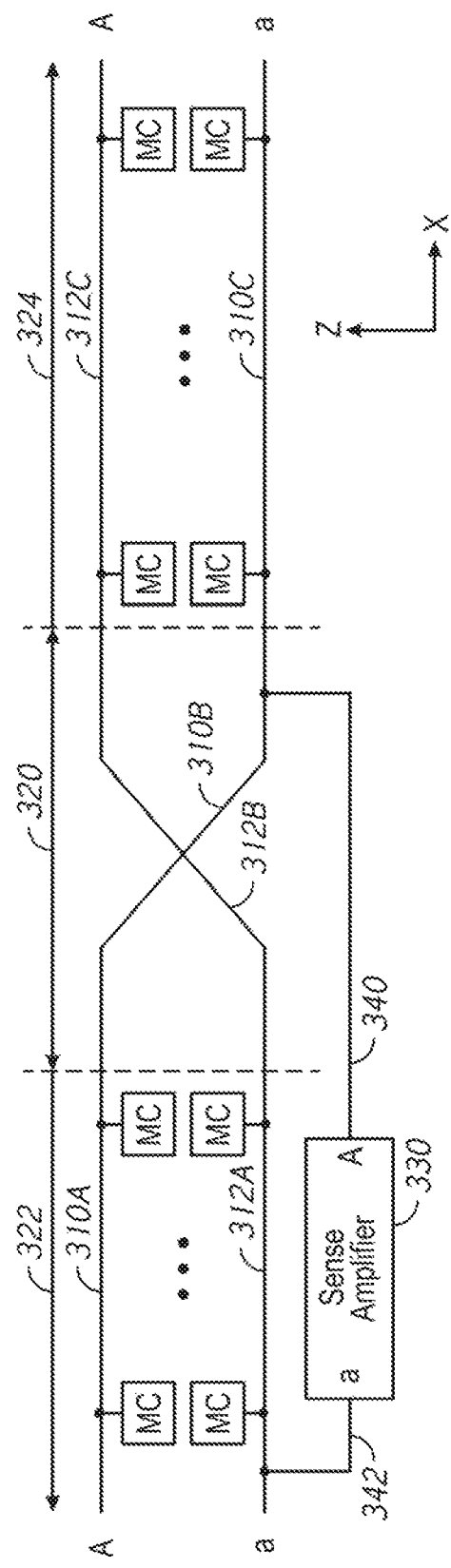

APPARATUSES AND METHODS FOR SENSE LINE ARCHITECTURES FOR SEMICONDUCTOR MEMORIES

BACKGROUND

In memory ICs, such as random access memories (RAMs), the data in the memory array are accessed by an external data path by means of a number of electrically conducting lines. The electrically conducting lines in the array are conventionally arranged in the form of an array of parallel metallization strips. For example, a dynamic RAM (DRAM) contains an array of hundreds of parallel sense lines (e.g., digit lines). A DRAM also contains an array of parallel access lines (e.g., word lines). The access lines, typically lie at a different planar level than the sense lines. The array of sense lines and the array of access lines lie perpendicular to each other, forming a grid. Memory cells in the DRAM lie at an intersection of an access line and a sense line.

The sense lines in a DRAM can give rise to electrical cross-coupling or "cross-talk." For example, access to any given sense line may spuriously influence memory cells connected to adjacent sense lines. The term "pattern sensitivity" is applied to this undesirable phenomenon. The problems of cross-talk and pattern sensitivity can arise in other interconnection arrays, such as address busses and data busses where similarly paired, parallel disposed line conductors are employed. In these environments, cross-talk and pattern sensitivity can result in undesirable errors.

Some memories include a twisted sense line architecture having sense lines that are "twisted" to reduce the negative effects of electrical cross-talk and pattern sensitivity. Conventional twisted sense line architectures have a number of disadvantages. One disadvantage is the relatively large amount of chip "real estate" that is typically used by twist junctions where the sense lines are twisted. Yet another disadvantage is that the use of the conventional twisted sense line architecture may result in an inefficient use of the memory cell array space. The conventional twisted sense line architecture does not use space efficiently because it may provide a lower packing density of memory cells than other sense line architecture.

There is a need for a new array architecture including twisted sense lines that may avoid the negative effects of conventional twisted sense line architectures.

BRIEF DESCRIPTION OF THE DRAWINGS

FIG. 2 is a diagram of a portion of a memory array.

FIG. 3 is a diagram of a portion of a memory array according to an embodiment of the disclosure.

DETAILED DESCRIPTION

Certain details are set forth below to provide a sufficient understanding of examples of the disclosure. However, it will be clear to one having skill in the art that examples of the disclosure may be practiced without these particular details. Moreover, the particular examples of the present disclosure described herein should not be construed to limit the scope of the disclosure to these particular examples. In other instances, well-known circuits, control signals, timing protocols, and software operations have not been shown in detail in order to avoid unnecessarily obscuring embodiments of the disclosure. Additionally, terms such as "couples" and "coupled" mean that two components may be directly or indirectly electrically and/or physically coupled. Indirectly coupled may imply that two components are coupled through one or more intermediate components.

Figure 1:
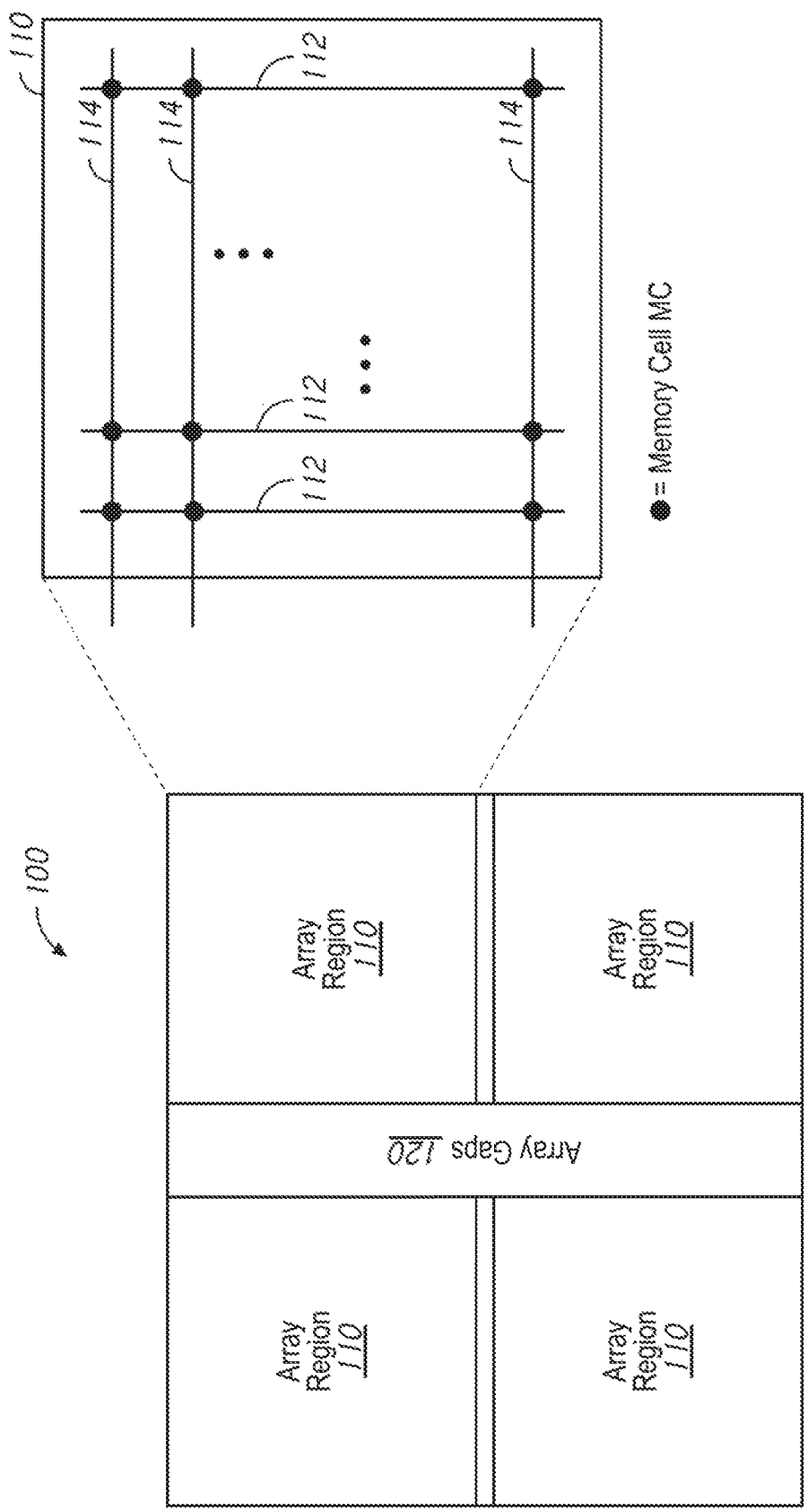
FIG. 1 is a block diagram of a portion of a memory array according to an embodiment of the disclosure.

FIG. 1 is a block diagram of a portion of a memory array 100 according to an embodiment of the disclosure. The memory array 100 includes memory cells MC in array regions 110 and further includes array gaps 120 disposed between the array regions. The memory cells in the array regions 110 are organized along access lines 112 and sense lines 114, with a memory cell positioned at the intersections of the access lines 112 and sense lines 114. The memory cells of the memory array may be various types of memory cells. For example, the memory cells may be volatile memory cells, non-volatile memory cells, and may have different memory cell structures and use various types of materials for the structures. The scope of the disclosure is not intended to be limited to any particular type of memory cells.

The access lines 112 are generally perpendicular in direction to the sense lines 114 of the array regions 110. The sense lines 114 extend along a direction through the respective array regions 110. Memory cells are not positioned in the array gaps 120, but the sense lines 114 may be electrically continuous through the array gap 120 from one array region 110 to an adjacent array region 110. As will be described in more detail below, at least some of the sense lines 114 extending through the array gap 120 from one array region 110 to an adjacent array region 110 twist in the array gap 120. As previously described, twisting sense lines may reduce the negative effects of electrical cross-talk and pattern sensitivity of the sense lines.

FIG. 2 is a diagram of a portion of a memory array. The portion shown in FIG. 2 includes sense lines 210 (also identified by "A") and 212 (also identified by "a") and memory cells MC coupled to sense lines 210 and 212. The memory cells MC are included in an array region 222 and in an array region 224. The array regions 222 and 224 are separated by an array gap 220 disposed therebetween. A sense amplifier 230 is coupled to the sense lines 210 and 212 by interconnects 240 and 242, respectively. The sense lines 210 and 212 may be formed from various conductive materials, including layers of conductive materials as well as conductive vias between the layers of conductive materials. Similarly, the interconnects 240 and 242 that couple the sense amplifier 230 to the sense lines 210 and 212 may also be formed from various conductive materials, including layers of conductive materials as well as conductive vias between the layers of conductive materials.

The portion of the memory of FIG. 2 shown in FIG. 2 is arranged along vertical and horizontal dimensions, with the z-axis indicating the vertical dimension and the x-axis indicating the horizontal dimension. For example, the sense line 212 is positioned below the sense line 210. The array regions 222 and 224 are laterally separated by the array gap 220. Memory cells MC are not positioned in the array gap 220.

The arrangement of the portion of the memory array shown in FIG. 2 is susceptible to issues related to the sense lines 210 and 212 cross-coupling to adjacent sense lines (not shown in FIG. 2) as well as to one another. As previously described, coupling of the sense lines may result in errors when reading data.

FIG. 3 is a diagram of a portion of a memory array according to an embodiment of the disclosure. The portion of the memory array of FIG. 3 may be included in the portion of the memory array 100 of FIG. 1 in some embodiments of the disclosure.

The portion of the memory array shown in FIG. 3 includes sense lines 310 (also identified by "A") and 312 (also identified by "a"), and further including memory cells MC coupled to sense lines 310 and 312. The memory cells MC are included in an array region 322 and in an array region 324. The array regions 322 and 324 are separated by an array gap 320 disposed therebetween. A sense amplifier 330 is coupled to the sense lines 310 and 312 by interconnects 340 and 342, respectively. The sense line 310 is coupled to a first node of the sense amplifier (node A) and the sense line 312 is coupled to a second node of the sense amplifier (node a).

The memory cells MC may be used to store data to be read at a later time. When activated (e.g., when activated using an access line, such as a word line) the memory cells may be accessed to read data and/or write data. The memory cells MC may be various types of memory cells, and may have various memory cell structures, and may be formed from different types of materials. In some embodiments of the disclosure, the memory cells may be volatile memory cells and in other embodiments of the disclosure, the memory cells may be nonvolatile memory cells. In some embodiments of the disclosure, a memory cell may be coupled to both the sense lines 310 and 312, rather than being coupled to one sense line or the other.

The sense lines 310 and 312 are electrically continuous along the entire length. The sense lines 310 and 312 may be formed from various conductive materials, including layers of conductive materials as well as conductive vias between the layers of conductive materials. Similarly, the interconnects 340 and 342 that couple the sense amplifier 330 to the sense lines 310 and 312 may also be formed from various conductive materials, including layers of conductive materials as well as conductive vias between the layers of conductive materials.

The portion of the memory of FIG. 3 shown in FIG. 3 is arranged along vertical and horizontal dimensions, with the z-axis indicating the vertical dimension (e.g., z-direction) and the x-axis indicating the horizontal direction (e.g., x-direction). The array regions 322 and 324 are laterally separated by the array gap 320. Memory cells MC are not positioned in the array gap 320. The sense amplifier 330 may be positioned below the sense lines 310 and/or 312 in some embodiments of the disclosure. Additionally, in some embodiments of the disclosure, the sense amplifier 330 is not positioned in the array gap 320. The sense amplifier 330 may be positioned beneath the sense lines 310 and 320, and have a portion or be entirely positioned in an array region in some embodiments of the disclosure.

The sense line 310 includes portions 310A, 310B, and 310C, and sense line 312 includes portions 312A, 312B, and 312C. The portions 310A and 312A include at least a portion in the array region 322 and the portions 310C and 312C include at least a portion in the array region 324. The portions 310B and 312B are included in the array gap 320. The portion 310A is positioned above the portion 312A and the portion 310C is positioned below the portion 312C. That is, one of the sense lines has a portion that is above the other sense line for an array region, and has another portion that is below the other sense line for another array region.

The two portions of a sense line are coupled together by a line portions (e.g., portion 310B or portion 312B) that have a vertical component (e.g., along the z-direction) to couple the sense line portions from one layer to another layer. The sense line portions 3101B and 312B coupling the other sense line portions (e.g., 310A and 310C and sense line portions 312A and 312C, respectively) of two different layers are positioned in the array gap 320. The portions 310A and 312C may be formed from the same layer of conductive material, and the portions 312A and 310C may be formed from the same layer of conductive material. The sense line portions 310B and 312B may include conductive layers and conductive vias coupling one conductive layer to another. The conductive layers and conductive vias included in the sense line portions 3101B and 312B may provide the vertical component coupling one portion of the sense line of one array region to the other portion of the sense line of another array region. The layers of conductive material may be separated by one or more layers of dielectric materials.

The sense line portions 310B and 312B provide a twist for the sense lines 310 and 312 that may reduce cross-coupling between adjacent sense lines. Positioning the sense line portions 310B and 312B avoids fabrication difficulties with providing a twist for a sense line in the array regions (e.g., array region 322 or 324), such as difficulties with fabrication and layout of the array region and the twist portion in the array region.

Additionally, the vertical arrangement of the sense lines 310 and 312 including the sense line portions 310B and 312B having vertical components allows for additional sense lines to be closely positioned adjacent to the sense lines 310 and 312. For example, additional sense lines may be positioned along a y-direction that is perpendicular to the x-direction and the z-direction (e.g., into and out of the page of FIG. 3).

Figure 4:
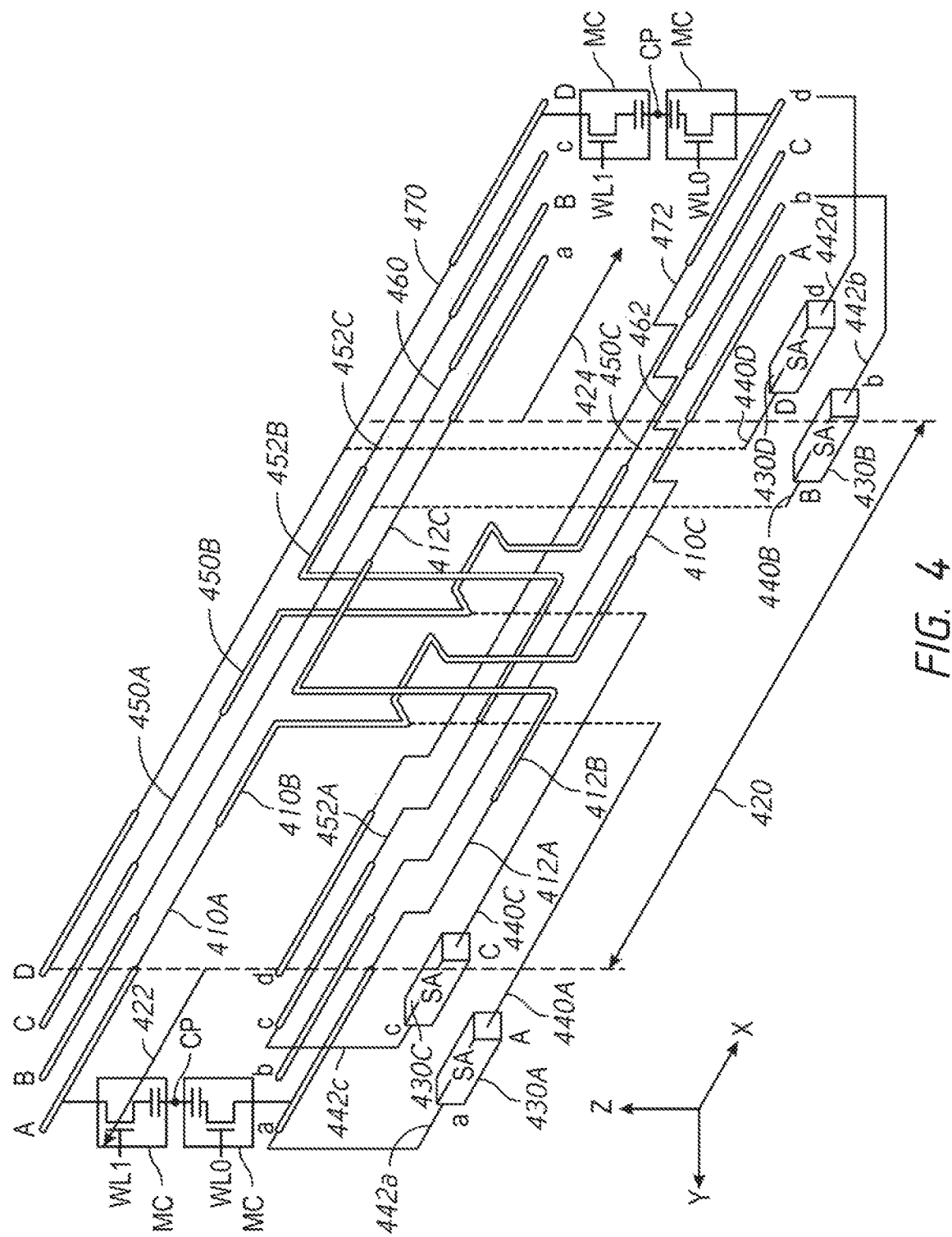
FIG. 4 is a diagram of a representation for an arrangement for adjacent sense lines according to an embodiment of the disclosure.

FIG. 4 is a diagram of an arrangement for adjacent sense lines according to an embodiment of the disclosure. FIG. 4 illustrates four pairs of sense lines 410 and 412 (sense lines A and a), 450 and 452 (sense lines C and c), 460 and 462 (sense lines B and b), and 470 and 472 (sense lines D and d). The arrangement of adjacent sense lines may be replicated to provide sense lines for a memory array in some embodiments of the disclosure.

The sense lines of FIG. 4 are arranged along vertical and horizontal dimensions, with the z-axis indicating the vertical dimension and the x-axis and y-axis indicating the horizontal dimension. For example, the sense lines A and a, B and b, C and c, and D and d, each generally extend in an x-direction along an x-axis, and the sense lines A and a, B and b, C and c, and D are positioned relative to one another in a y-direction along a y-axis. The sense lines of a pair may be positioned relative to one another in a z-direction along a z-axis. Each pair of sense lines are coupled to a respective sense amplifier: sense lines A and a are coupled to sense amplifier 430A through interconnects 440A and 442a, sense lines B and b are coupled to sense amplifier 430B through interconnects 440B and 442b, sense lines C and c are coupled to sense amplifier 430C through interconnects 440C and 442c, and sense lines D and d are coupled to sense amplifier 430D through interconnects 440D and 442d. Memory cells MC may be coupled to the sense lines A and a, B and b, C and c, and D and d in array regions 422 and/or 424. A memory cell MC may be coupled to one sense line in some embodiments of the disclosure. A memory cell MC may be coupled to two sense lines (e.g., both sense lines of a pair) in some embodiments of the disclosure. The array regions 422 and 424 are laterally separated by an array gap 420 disposed therebetween. Memory cells MC are not positioned in the array gap 420.

The sense lines A and a, B and b, C and c, D and d are electrically continuous along their entire lengths. The sense lines A and a, B and b, C and c, D and d may be formed from various conductive materials, including layers of conductive materials as well as conductive vias between the layers of conductive materials. Similarly, the interconnects 440A-D and 442a-d that couple the sense amplifiers 430A-D to the sense lines A and a, B and b, C and c, D and d may also be formed from various conductive materials, including layers of conductive materials as well as conductive vias between the layers of conductive materials.

The sense line A includes sense line portions 410A, 410B, and 410C and sense line a includes sense line portions 412A, 412B, and 412C. The sense line C includes sense line portions 450A, 450B, and 450C and sense line a includes sense line portions 452A, 452B, and 452C. The sense line portions 410A and 410C are positioned at two different layers with sense line portion 410A at a layer above the layer of sense line portion 410C. Similarly, the sense line portions 412A and 412C, 450A and 450C, and 452A and 452C are positioned at two different layers. The sense line portion 412A is at a layer below the layer of sense line portion 412C; the sense line portion 450A is at a layer above the layer of sense line portion 450C; and the sense line portion 452A is at a layer below the layer of sense line portion 452C. The sense lines 460 and 462 and the sense lines 470 and 472 generally do not switch relative positions to one another (e.g., from above to below and vice versa) across their lengths from one array region to another array region through the sense gap.

The sense line portions 410B and 412B and 450B and 452B each include a portion that includes a vertical component (e.g., in a z-direction along a z-axis) in the array gap 420. The sense line portion 410B couples the sense line portions 410A and 410C, which are at two different layers. Similarly, the sense line portion 412B couples the sense line portions 412A and 412C, which are at two different layers; the sense line portion 450B couples the sense line portions 450A and 450C, which are at two different layers, and the sense line portion 452B couples the sense line portions 452A and 452C, which are at two different layers. The sense line portions 410A, 412C, 450A, and 452C may be formed from the same layer of conductive material, and the portions 410C, 412A, 450C, and 452A may be formed from the same layer of conductive material. The sense lines 460 and 470 may be formed from the same layer of conductive material and the sense lines 462 and 472 may be formed from the same layer of conductive material. The sense line portions 410B, 412B, 450B, and 452B may include conductive layers and conductive vias coupling one conductive layer to another. The conductive layers and conductive vias included in the sense line portions 410B, 412B, 450B, and 452B may provide the vertical component coupling one portion of the sense line to the other portion of the sense line. The layers of conductive material may be separated by one or more layers of dielectric materials.

The sense line portions 410B and 412B provide a twist for the sense lines 410 and 412, and the sense line portions 450B and 452B provide a twist for the sense lines 450 and 452. However, in the embodiment of FIG. 4, the sense lines 460 and 462 are not twisted relative to one another and the sense lines 470 and 472 are not twisted relative to one another. In such embodiments of the disclosure, pairs of sense lines that are twisted are positioned between pairs of sense lines that are not twisted. However, the disclosure is not limited to such an arrangement, and the arrangement of sense lines shown in FIG. 4 is not intended to limit the scope of the disclosure to any particular arrangement of twisted sense lines and not twisted sense lines.

The twist of sense lines 410 and 412, and the twist of sense lines 450 and 452 may reduce cross-coupling between adjacent sense lines (e.g., between adjacent sense lines A and a, B and b, C and c, D and d shown in FIG. 4). Positioning the sense line portions 410B, 412B, 450B, and 452B in the array gap 420 avoids fabrication difficulties with providing a twist for a sense line in the array regions (e.g., array region 422 or 424), such as difficulties with fabrication and layout of the array region and the twist portion in the array region.

Figure 5:
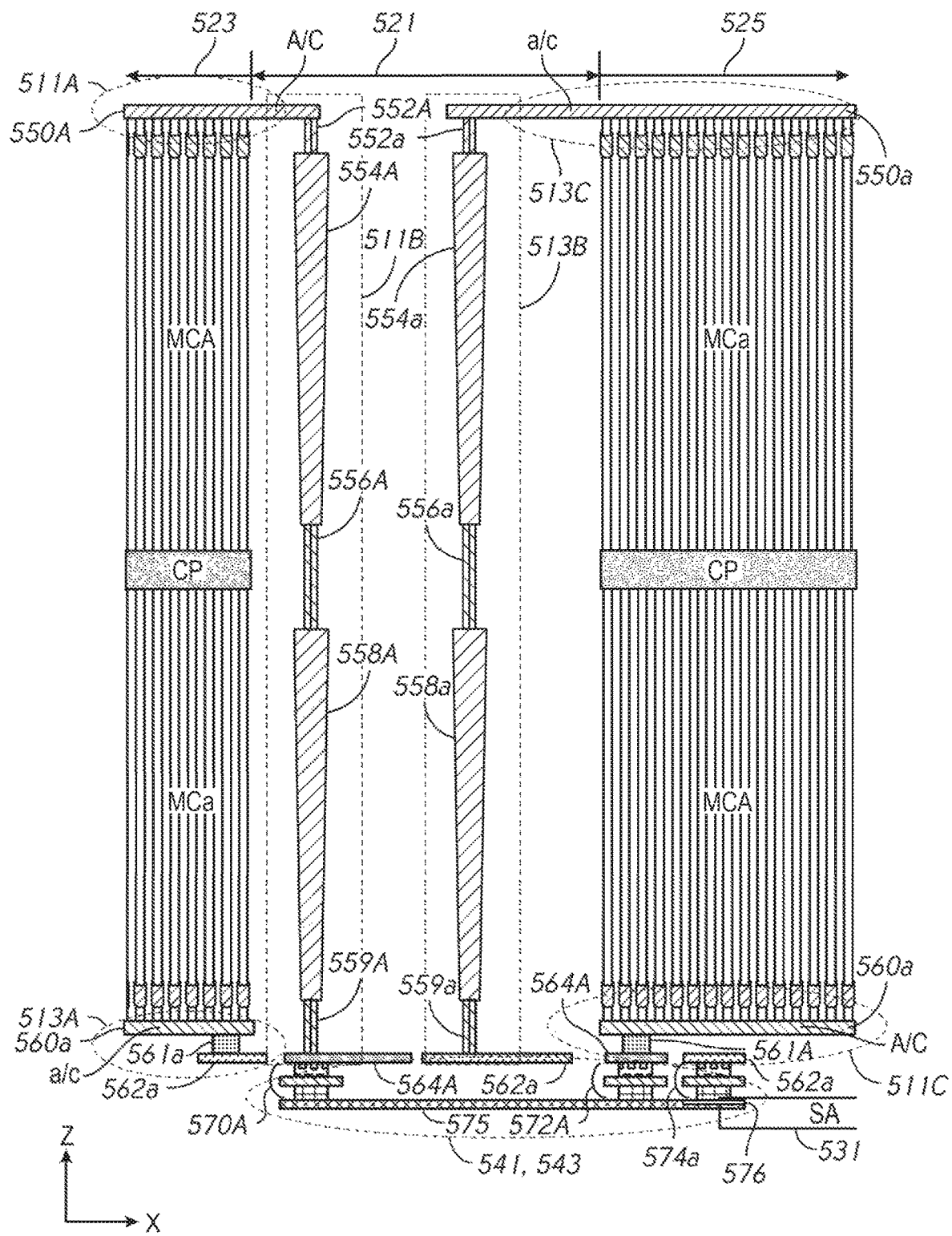
FIG. 5 is a cross-section diagram illustrating an arrangement of sense lines according to an embodiment of the disclosure.

FIG. 5 is a cross-section diagram illustrating an arrangement of sense lines according to an embodiment of the disclosure. The arrangement of sense lines of FIG. 5 may be used for sense lines 410 and 412 and for 450 and 452 of FIG. 4 in some embodiments of the disclosure.

FIG. 5 includes sense lines 511 and 513. The sense line 511 includes sense line portions 511A, 511B, and 511C, and the sense line 513 includes sense line portions 513A, 513B, and 513C. The sense lines 511 and 513 are arranged along vertical and horizontal dimensions, with the z-axis indicating the vertical dimension and the x-axis indicating the horizontal dimension. For example, the sense line portion 511A is at a different layer than the sense line portion za11C, and is coupled to sense line portion za11C by sense line portion 511B. The sense line portion 513A is at a different layer than the sense line portion za13C, and is coupled to sense line portion za13C by sense line portion 513B. In the embodiment of FIG. 5, the sense line portions 511A and 513C are at a layer that is above the layer of sense line portions 513A and 511C.

FIG. 5 further includes memory cells MC and a cell plate CP that is shared by the memory cells MCA and MCa between sense line portions 511A and 513A and by the memory cells MCA and MCa between sense line portions 511C and 513C. The memory cells MCA and MCa and cell plate CP are included in array regions 523 and 525, and the sense line portions 511B and 513B are included in array gap 521 disposed therebetween. The memory cells MCA and MCa may be various types of memory cells, and may have various memory cell structures, and may be formed from different types of materials. In some embodiments of the disclosure, the memory cells may be volatile memory cells and in other embodiments of the disclosure, the memory cells may be nonvolatile memory cells. In some embodiments of the disclosure, a memory cell may be coupled to both the sense lines 511 and 513, rather than being coupled to one or the other, as shown in the embodiment of FIG. 5.

A sense amplifier 531 is coupled to the sense lines 511 and 513 by interconnects 541 and 543, respectively. The sense lines 511 and 513 may be formed from various conductive materials, including layers of conductive materials as well as conductive vias between the layers of conductive materials. Similarly, the interconnects 541 and 543 that couple the sense amplifier 531 to the sense lines 511 and 513 may also be formed from various conductive materials, including layers of conductive materials as well as conductive vias between the layers of conductive materials. The sense amplifier 531 may be positioned below the sense lines 510 and/or 512 in some embodiments of the disclosure. Additionally, in some embodiments of the disclosure, the sense amplifier 531 is not positioned in the array gap 521. The sense amplifier 531 may be positioned beneath the sense lines 511 and 513, and have at least a portion or be entirely positioned in an array region in some embodiments of the disclosure.

For example, the sense line portions 511A and 513C may include the same conductive layer 550 and the sense line portions 513A and 511C may include the same conductive layer 560. The sense line portion 513A further includes conductive via 561a coupled to a conductive layer 562a and the sense line portion 511C further includes conductive via 561A coupled to conductive layer 564A. The sense line portions 511B and 513B include vertical structures, each including one or more conductive vias coupled between the sense line portions 511A and 511C and between the sense line portions 513A and 513C, all respectively, to provide electrically continuous sense lines 511 and 513. The sense line portion 511B includes conductive vias 552A, 554A, 556A, 558A, and 559A, and may include a portion of conductive layer 550A and a portion of conductive layer 564A. The sense line portion 513B includes conductive vias 552a, 554a, 556a, 558a, and 559a, and may include a portion of conductive layer 550a and a portion of conductive layer 562a.

The interconnect 541 includes conductive vertical structures 570A and 572A and conductive layer 575. The interconnect 541 couples the sense line 511 to the sense amplifier 531. The interconnect 543 includes a conductive vertical structure 574 and conductive layer 576. The interconnect 543 couples the sense line 513 to the sense amplifier 531. The conductive vertical structures 570A, 572A, and 574a may include conductive vias and/or conductive layers. For example, in the embodiment of FIG. 5, each of the conductive vertical structures 570A and 572A include dual conductive vias and an intermediate conductive layer therebetween.

The conductive layers and conductive vias previously described with reference to the different portions of sense lines 511 and 513, and the interconnects 541 and 543, may include the same conductive material or may include different conductive materials, and may be formed using fabrication technology now known or later developed. Various conductive materials may be used for the conductive layers and/or conductive vias. Non-limiting examples of conductive materials for the conductive layers and/or conductive vias include tungsten, aluminum, copper, doped polysilicon, and conductive materials including combinations such materials. However, other conductive materials may be used as well without departing from the scope of the disclosure.

Figure 6:
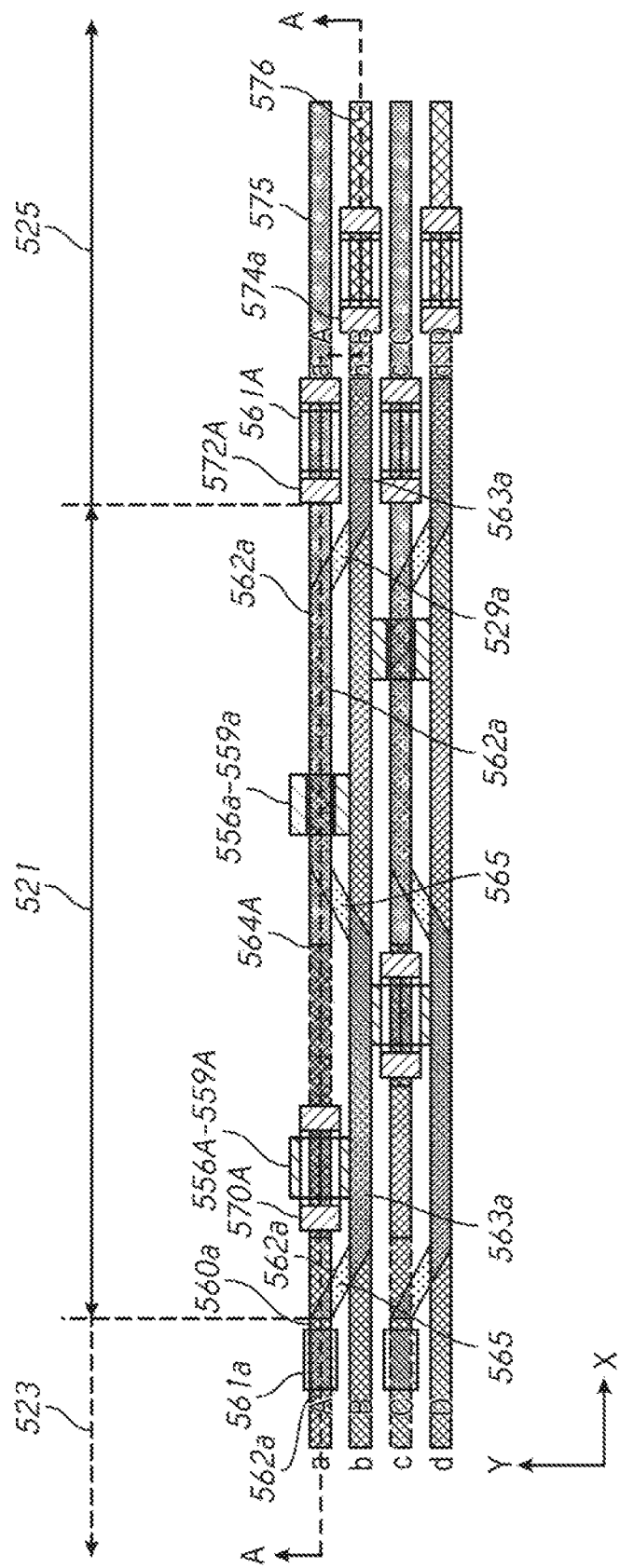
FIG. 6 is a diagram showing a layout of various layers and vias for sense lines according to an embodiment of the disclosure.

FIG. 6 is a diagram showing a layout of various layers and vias for an arrangement of sense lines according to an embodiment of the disclosure. The layout of FIG. 6 may be representative of a layout for the arrangement of sense lines shown in FIG. 5 in some embodiments of the disclosure. For ease of explanation, reference numbers for the arrangement of sense lines of FIG. 5 are also used in the layout of FIG. 6. The cross-section diagram of FIG. 5 shows the view of the layout of FIG. 6 at cut line A-A.

As shown in FIG. 6, the conductive layer 562a of the sense line portion 513A and the sense line portion 513B bends laterally (along an x-y plane) around conductive via 559A and conductive layer 564A of the sense line portion 511B. The conductive layer 562A further bends back to couple the sense line portion 513A with the sense line portion 513B. The conductive layer 562a also bends laterally around conductive via 561A and conductive layer 564A. The conductive layer 562a couples the sense line 513 to sense amplifier 531 through the conductive vertical structure 574a and conductive layer 576 of the interconnect 543.

The conductive layer of the sense line portion 513A and sense line portion 513B includes portions 662a that are aligned longitudinally along the x-direction with the conductive layer 564a of the sense line portion 511B. The conductive layer 562a of the sense line portion 513A and sense line portion 513B also includes portions 663a that are aligned longitudinally along the x-direction with the conductive layer of an adjacent sense line. The portions 662a and 663a of the sense line portions 513A and 513B are coupled into an electrically continuous sense line by bend portions 665. The bend portions 665 include a lateral component (e.g., along the y-direction) relative to the x-direction to cross from alignment with a sense line to alignment with an adjacent sense line.

The conductive layer 564A of the sense line portion 511B and 511C may include discontinuous sections that are coupled into an electrically continuous sense line through the interconnect 541 (e.g., conductive vertical structures 570A and 572A, and conductive layer 575). In such arrangements, the conductive vertical structures and layers of interconnect 541 may be considered to be shared with the sense line portions 511B and 511C. The discontinuous sections of the conductive layer 564A may be positioned in an area provided by the bends in the conductive layer 562a. The conductive layers 562a and 564A of the sense line portions 513A and 513B, and 511B and 511C, may be formed from the same conductive layer. In some embodiments of the disclosure, however, 562a and 564A are formed using separate mask (e.g., photolithographic) steps and/or separate etch steps.

Bending the conductive layer 562a of the sense line portions 513A and 513B in the array gap 521 around conductive structures and layers for the sense line portions 511B and 511C allows for the twisting of the sense lines 511 and 513 in the array gap 521. Such an arrangement may also be used in some embodiments of the disclosure for coupling to a sense amplifier 531 that is positioned below the sense lines 511 and/or 513. The arrangement may also be used in some embodiments of the disclosure for coupling to a sense amplifier 531 that is positioned beneath the sense lines 511 and/or 513, and have a portion or be entirely positioned in an array region in some embodiments of the disclosure.

FIG. 6 further illustrates another pair of sense lines (e.g., sense lines C and c) that are twisted in the array gap 521. The sense lines C and c may have the same arrangement along cut line A-A as sense lines 511 and 513 previously described. The pairs of sense lines B and b, and D and d are not twisted however. The twisted sense lines of A and a, and C and c, are disposed between not-twisted sense line. The layout of FIG. 6 may be replicated to provide more sense lines in the interleaved pattern of twisted sense lines and not-twisted sense lines.

The conductive layers and conductive vias previously described with reference to the different portions of sense lines and the interconnects of FIG. 6, may include the same conductive material or may include different conductive materials, and may be formed using fabrication technology now known or later developed. Various conductive materials may be used for the conductive layers and/or conductive vias. Non-limiting examples of conductive materials for the conductive layers and/or conductive vias include tungsten, aluminum, copper, doped polysilicon, and conductive materials including combinations such materials. However, other conductive materials may be used as well without departing from the scope of the disclosure.

From the foregoing it will be appreciated that, although specific embodiments of the disclosure have been described herein for purposes of illustration, various modifications may be made without deviating from the spirit and scope of the disclosure. Accordingly, the scope disclosure should not be limited any of the specific embodiments described herein.

What is claimed is:

1. An apparatus, comprising:
   a first sense line including first, second, and third sense line portions and electrically continuous through the first, second, and third sense line portions;
   a second sense line having fourth, fifth, and sixth sense line portions and electrically continuous through the fourth, fifth, and sixth sense line portions, wherein the first sense line portion is above the fourth sense line portion and the sixth sense line portion is above the third sense line portion;
   a first array region including memory cells coupled to the first sense line portion and the fourth sense line portion;
   a second array region laterally disposed from the first array region and including memory cells coupled to the third sense line portion and the sixth sense line portion; and
   an array gap disposed between the first and second array regions,
   wherein the first and fourth sense line portions extend into the array gap from the first array region and the third and sixth sense line portions extend into the array gap from the second array region, and
   wherein the second sense line portion includes a vertical component and couples the first sense line portion to the third sense line portion in the array gap and the fifth sense line portion includes a vertical component and couples the fourth sense line portion to the sixth sense line portion.

2. The apparatus of claim 1, wherein the second sense line portion includes at least one conductive via and wherein the fifth sense line portion includes at least one conductive via.

3. The apparatus of claim 1 wherein the first and sixth sense line portions are both formed from a first layer of conductive material and wherein the fourth and third sense line portions are both formed from a second layer of conductive material.

4. The apparatus of claim 1, further comprising:
   a sense amplifier;
   a first interconnect configured to couple the first sense line to the sense amplifier; and
   a second interconnect configured to couple the second sense line to the sense amplifier,
   wherein the sense amplifier, and first and second interconnects are disposed below a conductive layer of the third and fourth sense line portions.

5. The apparatus of claim 1 wherein the first array region includes first memory cells coupled to the first sense line portion and second memory cells coupled to the fourth sense line portion, and wherein the first memory cells and the second memory cells share a cell plate.

6. The apparatus of claim 5 wherein the first memory cells are disposed above the second memory cells, and the first and second memory cells are disposed between the first sense line portion and the fourth sense line portion in the first array region.

7. The apparatus of claim 1, further comprising:
   a third sense line including seventh, eighth, and ninth sense line portions and electrically continuous through the seventh, eighth, and ninth sense line portions; and
   a third sense line including seventh, eighth, and ninth sense line portions and electrically continuous through the seventh, eighth, and ninth sense line portions; and
   a fourth sense line including tenth, eleventh, and twelfth sense line portions and electrically continuous through the tenth, eleventh, and twelfth sense line portions,
   wherein the seventh sense line portion is above the tenth sense line portion and the ninth sense line portion is above the twelfth sense line portion, and
   wherein the third and fourth sense lines are laterally adjacent the first and second sense lines.

8. The apparatus of claim 7 wherein the first and sixth sense line portions are both formed from a first layer of conductive material and wherein the fourth and third sense line portions are both formed from a second layer of conductive material,
   wherein the seventh and ninth sense line portions are formed from the first layer of conductive material, and
   wherein the tenth and twelfth sense line portions are formed from the second layer of conductive material.

9. An apparatus, comprising:
   a plurality of pairs of sense lines electrically continuous through first and second array regions and through an array gap disposed between the first and second array regions; and
   a plurality of memory cells coupled to the plurality of pairs of sense lines and included in the first and second array regions,
   wherein at least one pair of sense lines of the plurality of pairs of sense lines includes sense line portions in the array gap to twist the sense lines of the pair of sense lines, the sense line portions in the array gap having vertical components to couple a first conductive layer to a second conductive layer that is below the first conductive layer.

10. The apparatus of claim 9 wherein the at least one pair of sense lines of the plurality of pairs of sense lines is disposed between two other pairs of sense lines of the plurality of pairs of sense lines, wherein the two other pairs of sense lines do not include sense line portions in the array gap to twist the sense lines.

11. The apparatus of claim 9, further comprising:
   a sense amplifier disposed below the plurality of pairs of sense lines;
   a first interconnect configured to couple a first sense line of the at least one pair of sense lines of the plurality of pairs of sense lines to the sense amplifier; and
   a second interconnect configured to couple a second sense line of the at least one pair of sense lines of the plurality of pairs of sense lines to the sense amplifier.

12. An apparatus, comprising:
   a first array region including first portions of a plurality of sense lines and further including memory cells coupled to the first portions of the plurality of sense lines;
   a second array region including second portions of the plurality of sense lines and further including memory cells coupled to the second portions of the plurality of sense lines; and
   an array gap disposed between the first and second array regions and including third portions of the plurality of sense lines and not including any memory cells, each third portion of the plurality of sense lines including conductive structures having vertical components configured to couple the first portions and second portions of the plurality of sense lines to provide an electrically continuous sense lines through the first and second array regions and the array gap.

13. The apparatus of claim 12 wherein the first portions of the plurality of sense lines are formed from a first conductive layer and the second portions of the plurality of sense lines are formed from a second conductive layer disposed below the first conductive layer.

14. The apparatus of claim 13 wherein the first array region further includes first portions of a second plurality of sense lines formed from the second conductive layer and the second array region further includes second portions of the second plurality of sense lines formed from the first conductive layer, and wherein the array gap includes third portions of the second plurality of sense lines, each third portion of the second plurality of sense lines including conductive structures having vertical components configured to couple the first portions and second portions of the second plurality of sense lines to provide an electrically continuous second plurality of sense lines through the first and second array regions and the array gap.

15. The apparatus of claim 13, further comprising a plurality of sense amplifiers positioned below the second conductive layer and in the first or second array region.

16. The apparatus of claim 15, further comprising a plurality of first interconnects and a plurality of second interconnects, wherein each of the plurality of first interconnects couples a respective sense line of the plurality of sense lines to a respective one of the plurality of sense amplifiers and wherein each of the plurality of second interconnects couples a respective sense line of the second plurality of sense lines to a respective one of the plurality of sense amplifiers.

17. The apparatus of claim 16 wherein the plurality of first interconnects and plurality of second interconnects are formed below the second conductive layer.

18. The apparatus of claim 13 wherein the third portion of the plurality of sense lines includes a plurality of conductive vias.

19. The apparatus of claim 18 wherein the conductive vias are coupled between the first conductive layer and the second conductive layer.

* * * * *